(12) United States Patent
Tsai

(10) Patent No.: US 6,347,958 B1
(45) Date of Patent: Feb. 19, 2002

(54) CONNECTING DEVICE TO VEHICLE BATTERY TERMINALS

(75) Inventor: Liao-Tai Tsai, Taipei (TW)

(73) Assignee: Real Power Cap Company (TW)

( * ) Notice: Subject to any disclaimer, the term of this patent is extended or adjusted under 35 U.S.C. 154(b) by 0 days.

(21) Appl. No.: 09/664,365

(22) Filed: Sep. 18, 2000

(51) Int. Cl.$^7$ ................................. H01R 3/00
(52) U.S. Cl. ............. 439/488; 439/504; 439/910; 439/754; 429/92; 340/653
(58) Field of Search ..................... 439/488, 504, 439/754, 762, 763, 764, 910; 340/636, 653; 429/90, 91, 92, 93

(56) References Cited

U.S. PATENT DOCUMENTS

| | | | |
|---|---|---|---|
| 3,974,441 A | * 8/1976 | Van Den Haak | 340/253 |
| 4,010,456 A | * 3/1977 | Erni | 340/636 |
| 4,237,198 A | * 12/1980 | Eby et al. | 429/93 |
| 4,675,255 A | * 6/1987 | Pfeifer et al. | 429/92 |
| 5,171,169 A | 12/1992 | Butcher et al. | 439/755 |

* cited by examiner

Primary Examiner—Tho D. Ta

(57) ABSTRACT

A connecting device applicable to a battery terminal can display the electrical condition, such as the voltage of power and the condition of the fuses of each line. The connecting device includes a main body having a clamp at one end for fixing to the battery terminal, and the other end for carrying a display unit and connecting cables of appliances. The display unit makes the connecting device displayable with electrical conditions directly without the need of using other testing devices.

6 Claims, 3 Drawing Sheets

CONNECTING DEVICE TO VEHICLE BATTERY TERMINALS

BACKGROUND OF THE INVENTION

1. Field of Invention

The present invention generally relates to an electrical connecting device to a power source, and more particularly relates to a connecting device applicable to a battery terminal for leading current to an appliance and showing the electrical condition.

2. Related Art

The battery of a vehicle provides power to a variety of devices in the vehicle. There is also a need for the user to connect other electrical appliances, such as vehicular refrigerator, television, audio/video system or global positioning system, to the battery power. An electrical connecting device, as disclosed by U.S. Pat. No. 5,171,169, or a similar one as shown in FIG. 1, can be used for this purpose. The connecting device mainly includes a clamp easily fixed on the battery terminal, and an adapter block electrically connected to the clamp for connecting and disconnecting a plurality of cables of appliances. Some other connector structures may further include fuses for each connecting port to prevent from overload and danger.

When using the aforesaid connectors, the user has to use a testing device, such as a voltage meter, to check if the power is well connected, the voltage is stable, or the fuse has burnt. The situation is rather bothersome if the user doesn't have a testing device, or isn't familiar with the device that the user has to prepare the device and learn to use it.

SUMMARY OF THE INVENTION

It is therefore a major object of the present invention to provide a connecting device applicable to a vehicular battery terminal for leading current to an appliance and showing the electrical condition through a display unit without the need of using additional testing devices.

To achieve the aforesaid object, a connecting device applicable to a vehicular battery terminal includes at least a conductive main body and a display unit. One end of the main body is formed with a clamp for fixing to a battery terminal and leading power to at least an appliance. The other end of the main body is a carrier for the display unit and cables. The display unit includes a display, a circuit board and a plurality of connecting pins. The connecting pins inserted into the carrier electrically connect the display unit to the main body so that the display will show the electrical status, such as voltage of the battery power. The display can be a liquid crystal display to indicate the voltage or current of the battery power. Some further indicators, such as light emitting diodes, can be used to indicate by flash or light if the fuse of each line is normal. A window can also be mounted on the display unit to protect it from being contaminated by dust. The display unit makes the connecting device displayable with electrical conditions directly without the need of using other testing devices.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

Figure 2:
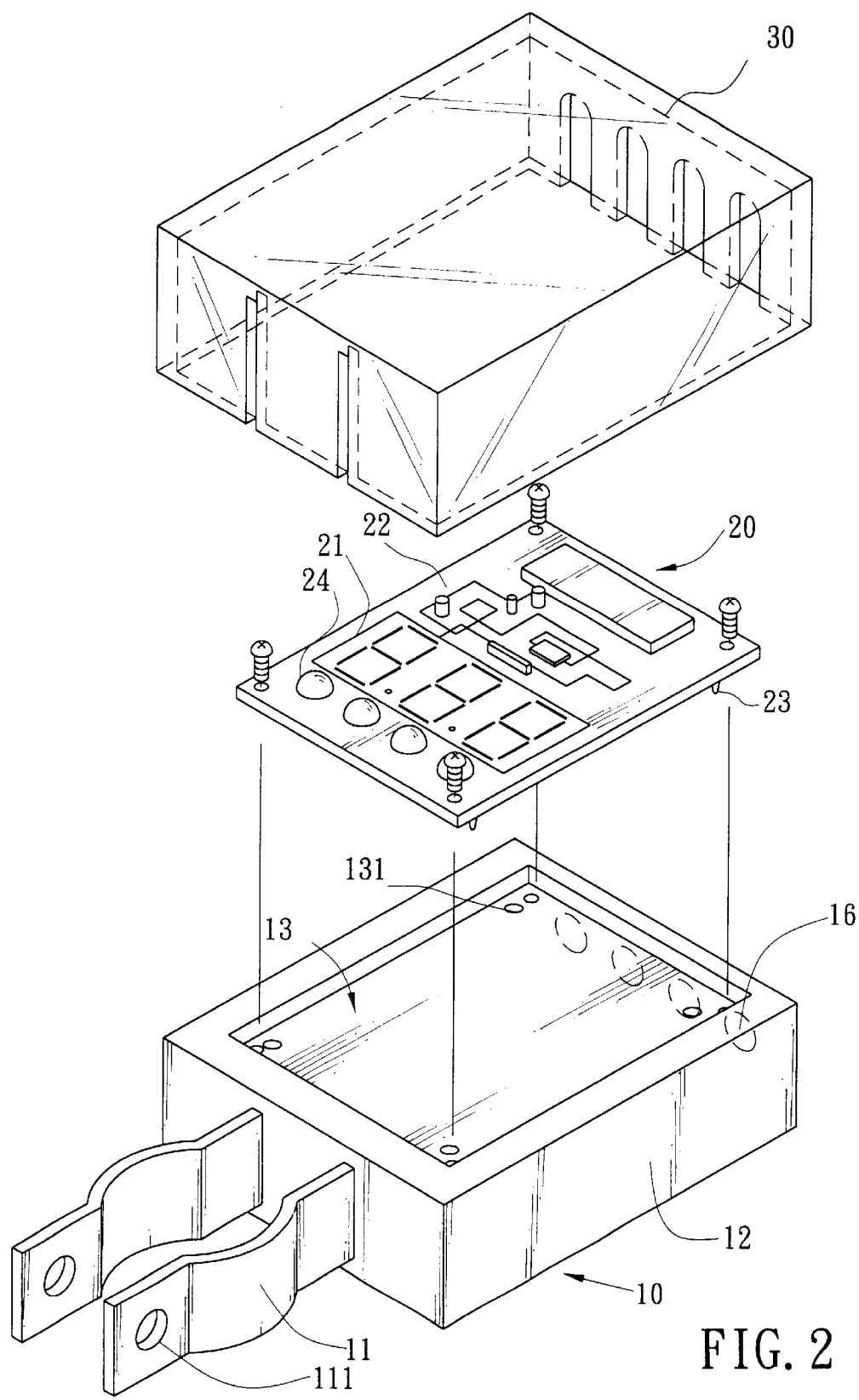
FIG. 2 is an exploded view of a connecting device according to the present invention.

As shown in FIG. 2, a connecting device applicable to a vehicular battery terminal includes at least a conductive main body 10 for connecting to the vehicular battery power and a display unit 20. One end of the main body 10 is formed with a clamp 11 for fixing to an unshown battery terminal and leading power to at least an appliance. Two corresponding holes 111 are formed on two fingers of the clamp 11 and fastened by a screw in order to fix the clamp 11 on the battery terminal. The other end of the main body 10 is a carrier 12 for holding unshown cables. The display unit 20 includes a display 21, a circuit board 22 and a plurality of connecting pins 23. The connecting pins 23 inserted into the carrier 12 electrically connect the display unit 20 to the main body 10. Screws 40 are used to fasten the display unit 20 to the main body 10. The connecting pins 23 link the power to the circuit board 22 so that the display 21 will show the electrical status, such as voltage of the battery power.

Figure 3:
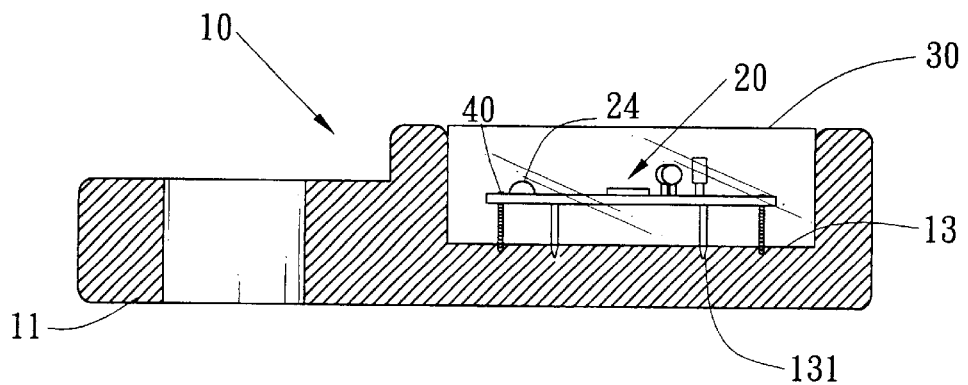
FIG. 3 is a side view of a connecting device of a first embodiment of the present invention.

FIG. 3 shows a side view of a connecting device of a first embodiment of the present invention. A recess 13 is formed on the carrier 12. A plurality of holes 131 are formed in the recess 13 to receive the connecting pins 23 of the display unit 20. The display unit 20 is fixed by screw 40 to the recess 13.

Figure 4:
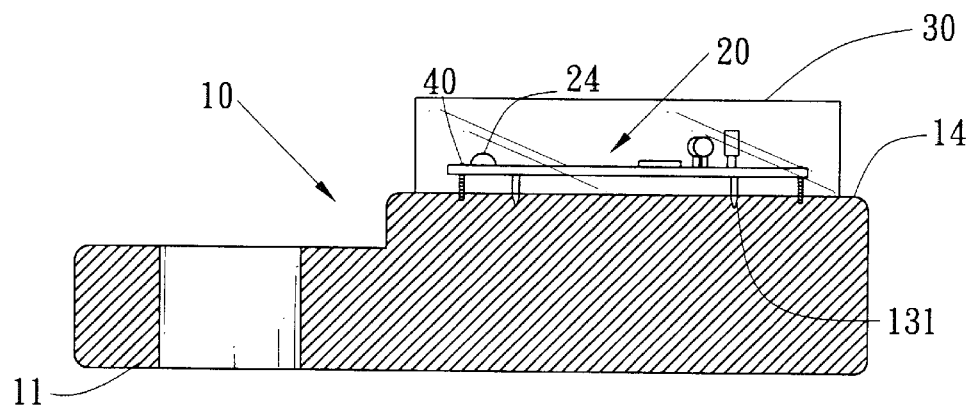
FIG. 4 is a side view of a connecting device of a second embodiment of the present invention.

FIG. 4 shows a side view of a connecting device of a second embodiment of the present invention. The display unit 20 is mounted on the carrier 12, which is the top 14 of the main body 10. A plurality of holes 131 are formed on the top 14 to receive the connecting pins 23 of the display unit 20. The display unit 20 is fixed by screw 40 to the top 14.

Figure 5:
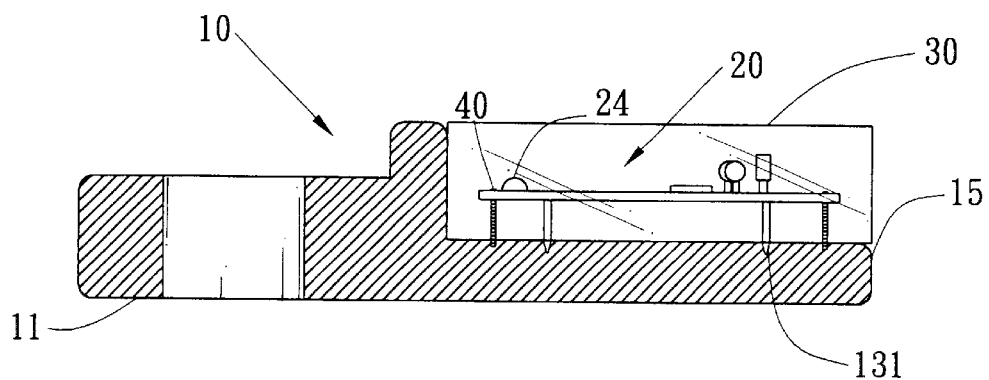
FIG. 5 is a side view of a connecting device of a third embodiment of the present invention.

FIG. 5 shows a side view of a connecting device of a third embodiment of the present invention. The display unit 20 is mounted on a surface 15 lower than the top of the main body 10. A plurality of holes 131 are formed on the surface 15 to receive the connecting pins 23 of the display unit 20. The display unit 20 is fixed by screw 40 to the surface 15.

Further referring to FIG. 2, the display 21 can be a liquid crystal display to indicate the voltage or current of the battery power. Some further indicators 24, such as light emitting diodes, can be used to indicate by flash or light if the fuse of each line is burnt or normal. A window 30 can also be mounted on the display unit 20 to protect it from being contaminated by dust.

Figure 1:
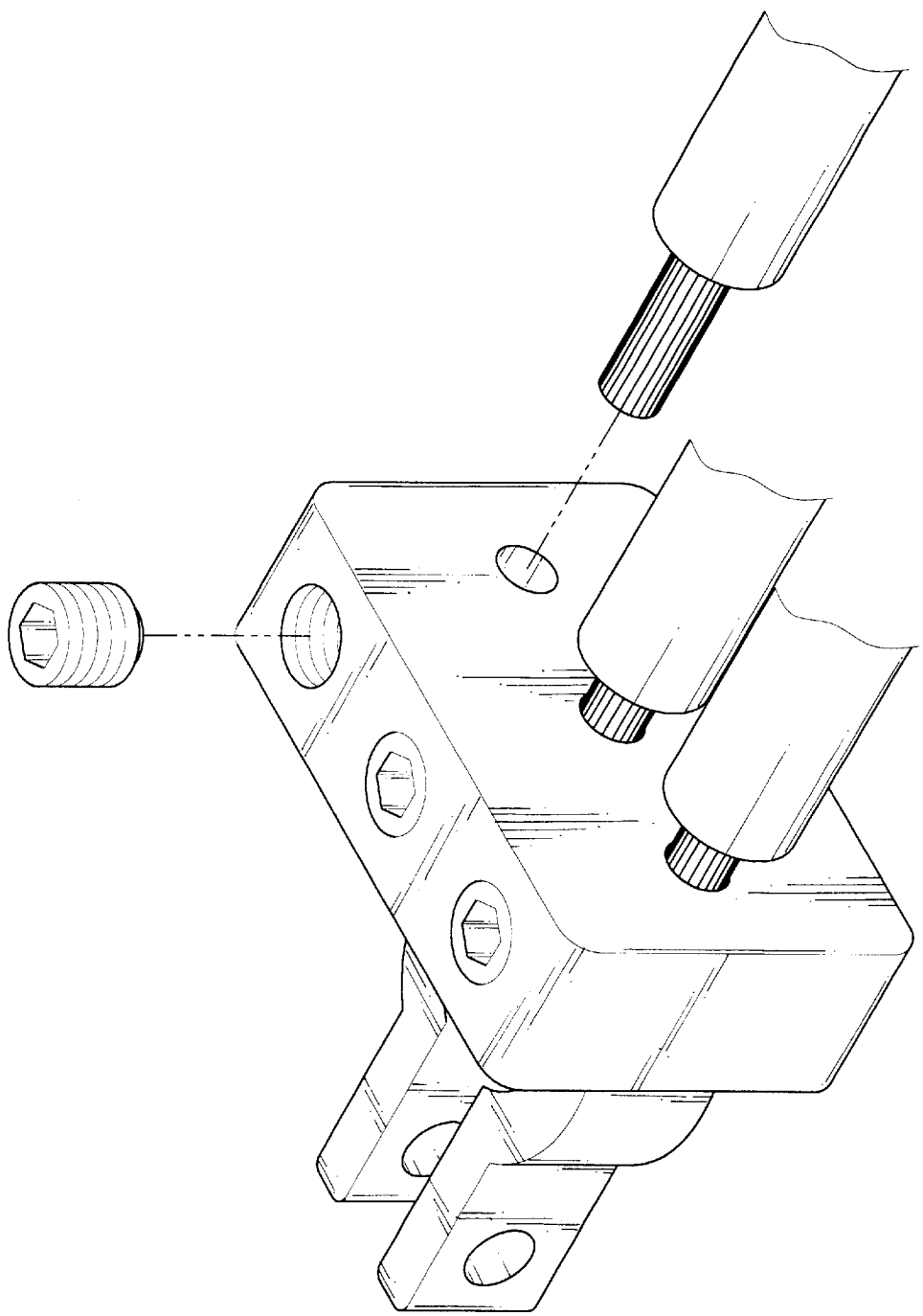
FIG. 1 is a usage example of a conventional connecting device.

When the connecting device is used, the clamp 11 is fixed to the battery terminal. Then, the cables of appliances can be connected through output ports 16 of the main body 10. The connection is like the manner shown in FIG. 1.

To check the voltage of the battery and the status of each line, the user has just to monitor the display 21 of the display unit 20 without the need of using other testing devices. In order to protect the display unit 20 and make the display 21 easily be watched, the window 30 mounted on the display unit 20 is made of a transparent material.

As described above, the connecting device applicable to a battery terminal according to the present invention can display the electrical condition, such as the voltage of power and the condition of the fuses of each line. Therefore, the user doesn't need to use other testing devices, and the problem of the power or the lines can be easily checked.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A connecting device applicable to a vehicular battery terminal comprising at least:

an electrically conductive main body, having one end formed with a clamp for fixing to the battery terminal and leading power to at least an appliance, and another end formed with a carrier for cables;

a display unit, mounted on said main body, comprising:

a circuit board;

a plurality of connecting pins, inserted into the carrier for linking the battery power to the circuit board;

a display mounted on the circuit board, showing the electrical status of the battery power; and a window, made of a transparent material and mounted on said display unit for protecting and showing the same.

2. A connecting device applicable to a vehicular battery terminal as recited in claim 1 wherein the carrier is formed with a recess for mounting the display unit.

3. A connecting device applicable to a vehicular battery terminal as recited in claim 1 wherein the carrier is formed with a plane at the top of the main body for mounting the display unit.

4. A connecting device applicable to a vehicular battery terminal as recited in claim 1 wherein the carrier is formed with a plane lower than top of the main body for mounting the display unit.

5. A connecting device applicable to a vehicular battery terminal as recited in claim 1 wherein the display is a liquid crystal display.

6. A connecting device applicable to a vehicular battery terminal as recited in claim 5 wherein the display unit further comprises a plurality of light emitting diodes.

* * * * *